United States Patent
Jiang et al.

(10) Patent No.: US 10,057,998 B1
(45) Date of Patent: Aug. 21, 2018

(54) FLEXIBLE DISPLAY DEVICE

(71) Applicant: SHANGHAI TIANMA MICRO-ELECTRONICS CO., LTD., Shanghai (CN)

(72) Inventors: Ke Jiang, Shanghai (CN); Hebing Feng, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 15/717,628

(22) Filed: Sep. 27, 2017

(30) Foreign Application Priority Data

Mar. 31, 2017  (CN) .......................... 2017 1 0208211

(51) Int. Cl.
| | |
|---|---|
| *H05K 5/00* | (2006.01) |
| *H05K 5/02* | (2006.01) |
| *H05K 1/02* | (2006.01) |
| *H01F 7/02* | (2006.01) |
| *G06F 3/041* | (2006.01) |

(52) U.S. Cl.
CPC .......... *H05K 5/0017* (2013.01); *H05K 1/028* (2013.01); *H05K 5/0217* (2013.01); *G06F 3/041* (2013.01); *H01F 7/02* (2013.01)

(58) Field of Classification Search
CPC combination set(s) only.
See application file for complete search history.

(56) References Cited

U.S. PATENT DOCUMENTS

| | | | | |
|---|---|---|---|---|
| 7,426,107 B2 * | 9/2008 | Yeh | ........................ | G06F 1/1626 340/815.4 |
| 7,558,057 B1 * | 7/2009 | Naksen | ................. | G06F 1/1613 361/679.3 |
| 7,667,962 B2 * | 2/2010 | Mullen | ................. | G06F 1/1624 359/461 |
| 7,714,801 B2 * | 5/2010 | Kimmel | ................ | G06F 1/1616 345/1.3 |
| 7,830,333 B2 * | 11/2010 | Aoki | ..................... | G06F 1/1601 345/1.3 |
| 8,174,628 B2 * | 5/2012 | Matsushita | ....... | G02F 1/133305 348/836 |
| 8,229,522 B2 * | 7/2012 | Kim | .................... | H04M 1/0268 361/679.06 |
| 8,379,377 B2 * | 2/2013 | Walters | ................. | G06F 1/1641 248/917 |
| 8,493,726 B2 * | 7/2013 | Visser | ................... | G06F 1/1601 361/679.05 |

(Continued)

FOREIGN PATENT DOCUMENTS

CN         102057342 B        2/2014

*Primary Examiner* — Lisa Lea Edmonds
(74) *Attorney, Agent, or Firm* — Alston & Bird LLP

(57) ABSTRACT

A flexible display device is disclosed which includes a body having a body bearing face; a flexible display screen having a fixed section and at least one bent section, where the fixed section overlies the body bearing face, and is connected with the body, and the bent section can be bent in a first axis direction, and folded to the backside of the body bearing face; and a housing enclosing the body and the flexible display screen, which can be opened in a second axis direction relative to the body to expose the flexible display screen entirely, where the first axis and the second axis are two intersecting axes parallel to the body bearing face.

14 Claims, 11 Drawing Sheets

(56) References Cited

U.S. PATENT DOCUMENTS

| | | | |
|---|---|---|---|
| 8,508,920 B2* | 8/2013 | Huitema | G09F 9/301 312/223.3 |
| 8,711,566 B2* | 4/2014 | O'Brien | G06F 1/1624 361/724 |
| 9,377,817 B2* | 6/2016 | Eguchi | G06F 1/1652 |
| 9,572,272 B2* | 2/2017 | Lee | H04M 1/0216 |
| 9,733,744 B2* | 8/2017 | Lee | G06F 3/0412 |
| 9,911,369 B2* | 3/2018 | Kim | G09F 9/301 |
| 2007/0004475 A1* | 1/2007 | Kuo | H04M 1/0214 455/575.3 |
| 2012/0162876 A1* | 6/2012 | Kim | H04M 1/0237 361/679.01 |
| 2012/0280924 A1* | 11/2012 | Kummer | H04M 1/0235 345/173 |
| 2012/0314400 A1* | 12/2012 | Bohn | G09F 9/301 362/97.1 |
| 2013/0120912 A1* | 5/2013 | Ladouceur | H04M 1/0268 361/679.01 |
| 2014/0247544 A1* | 9/2014 | Ryu | G09F 11/18 361/679.01 |
| 2015/0002398 A1* | 1/2015 | Nakhimov | G06F 1/1652 345/163 |
| 2015/0177789 A1* | 6/2015 | Jinbo | G06F 1/1652 313/511 |
| 2016/0070304 A1* | 3/2016 | Shin | H04M 1/0268 361/679.26 |
| 2016/0081204 A1* | 3/2016 | Park | G06F 1/1652 361/807 |
| 2016/0183364 A1* | 6/2016 | Choi | G06F 1/1652 361/679.01 |
| 2016/0205791 A1* | 7/2016 | Kim | G06F 1/1652 361/679.01 |
| 2016/0374228 A1* | 12/2016 | Park | G09F 9/301 |
| 2017/0075388 A1* | 3/2017 | Yee | G06F 1/1652 |
| 2018/0074553 A1* | 3/2018 | Yamazaki | G06F 1/1652 |

* cited by examiner

FLEXIBLE DISPLAY DEVICE

CROSS-REFERENCES TO RELATED APPLICATIONS

This application claims priority to Chinese patent application No. CN201710208211.8 filed on Mar. 31, 2017 and titled "FLEXIBLE DISPLAY DEVICE", which is incorporated herein by reference in its entirety.

FIELD

The present application relates to the field of display devices, and particularly to flexible display devices.

BACKGROUND

Portable display terminals have become increasingly popular along with the development of communication, semiconductor, and optics technologies, and thus have altered our living environment, and also transformed our sciences and technologies.

The "hard screen" as the portable display terminals have become matured display technologies. There are ongoing and intensive researches on the "soft screen" technologies which are more portable and convenient than the "hard screen". At present, flexible display devices in the market are still predominated by Organic Light-Emitting Diode (OLED) display and Electrophoresis Display (EPD), where the EPD products in the market are currently limited to static electronic books due to their low response speed, full chromatic aberration, and other technological problems; and the OLED displays have become predominant among the existing flexible display products due to their self-luminescence, high response speed, wide angle of view, high definition, high brightness, high robustness against bending, low power consumption, and other advantages.

The existing flexible display devices include wound flexible display devices, folded flexible display devices, etc., and generally their display screens are wound or folded into their interiors to protect the screens, and to make it portable; and since the existing flexible display devices can display an image only after their screens are spread, the screens have to be folded and spread so frequently that they may be easily damaged, and thus typically have a shorter service lifetime.

SUMMARY

Embodiments of the application disclose a flexible display device which improves the service lifetime of the flexible display device.

In order to attain the object above, the disclosure provides the following technical solutions:

An embodiment of the disclosure provides a flexible display device including: a body including a body bearing face; a flexible display screen including a fixed section and at least one bent section, wherein the fixed section overlies the body bearing face, and is connected with the body; and the bent section can be bent in a first axis direction, and folded to the backside of the body bearing face; a housing enclosing the body and the flexible display screen, which can be opened in a second axis direction relative to the body to expose the flexible display screen entirely; wherein the second axis and the first axis are two intersecting axes parallel to the body bearing face.

In the flexible display device above, the fixed section of the flexible display screen overlays the body bearing face, and is connected with the body, that is, the side of the flexible display screen away from the body bearing face is the display side; and the bent section of the flexible display screen can be folded to the backside of the body bearing face, that is, the display side of the flexible display screen is oriented outward whether the flexible display screen is spread or folded, and furthermore the flexible display screen can display whether it is spread or folded. Furthermore the flexible display screen in use will be folded and spread less frequently, so it will not be easily damaged; and since the flexible display device further includes the housing enclosing the body and the flexible display screen, the flexible display screen can be well protected, and cannot be easily damaged. In summary, A longer service lifetime of the flexible display device is expected.

Furthermore in the flexible display device above, the flexible display screen can be folded and spread in the first axis direction parallel to the body bearing face, and the housing can be closed or opened in the second axis direction parallel to the body bearing face and intersecting with the first axis, so the housing will be simply opened for the folded flexible display screen to be fully exposed, and no space will be reserved for the flexible display screen to be spread; and furthermore the housing will be opened smaller so that it will be convenient to open the housing of the flexible display device above, and when the housing is opened, then it will occupy a smaller space, and it will be convenient to carry the flexible display device around.

Optionally the second axis and the first axis are orthogonal to each other.

Optionally the housing includes two half-housings which can be put together into a closed space, and the two half-housings can be moved in opposite directions over the second axis direction relative to the body to close and open the housing.

Optionally a housing support section parallel to the body bearing face is arranged on the side of each half-housing in the housing proximate to the body bearing face.

Optionally the housing support sections of the two half-housings include touch sense elements.

Optionally the housing support sections of the two half-housings include display elements.

Optionally a first magnet is arranged on the bent section; a second magnet is arranged in the body, the second magnet and the first magnet are magnetically attracted to each other; and a third magnet is arranged in each housing support section, the third magnet and the first magnet are magnetically attracted to each other.

Optionally the flexible display device further includes: a rotation component configured to drive the flexible display screen to rotate around a rotation axis perpendicular to the body bearing face.

Optionally the rotation component includes a rotating disk embedded in the body bearing face, and movable in rotation relative to the body bearing face, and a concave groove is arranged on the side of the rotating disk proximate to the flexible display screen, and a printed circuit board configured to drive the flexible display screen is arranged in the concave groove; and the fixed section of the flexible display screen is connected with the body through the rotating disk.

Optionally the flexible display screen includes: a flexible screen; a flexible housing enclosing the side of the flexible screen proximate to the body; and a flexible printed circuit located between the flexible screen and the flexible housing, and electrically connected with the flexible screen; wherein an opening is arranged through the flexible housing, and the flexible printed circuit is electrically connected with the printed circuit board through the opening.

Optionally the rotating disk is embedded in the body bearing face while being movable upward and downward relative to the body bearing face.

Optionally the body includes: two sliding rods extending in the second axis direction, wherein the two sliding rods are connected with the housing while being extendable and retractable relative to the housing; and a carrier clamped between the two sliding rods, wherein the carrier is arranged with the body bearing face.

Optionally the sliding rods are arranged with limit structures configured to limit in position the sliding rods and the housing from being moved from each other.

Optionally the two sliding rods are arranged respectively on two sides of the body bearing face in the second axis direction; and the carrier is movable in the direction perpendicular to the body bearing face relative to the two sliding rods.

BRIEF DESCRIPTION OF THE DRAWINGS

FIG. 12 is a side view of the flexible display device in FIG. 10a;

DETAILED DESCRIPTION OF THE EMBODIMENTS

Figure 1:
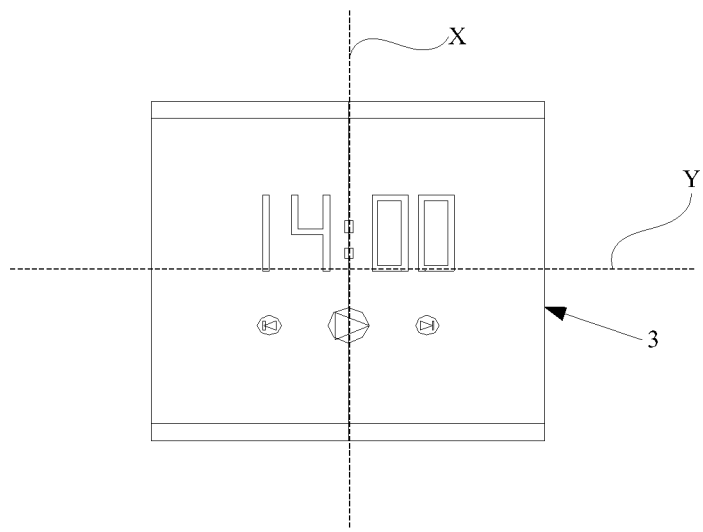
FIG. 1 is a schematic front view of a flexible display device according to an embodiment of the disclosure when its housing is closed.

The technical solutions according to the embodiments of the disclosure will be described below clearly and fully with reference to the drawings in the embodiments of the disclosure, and apparently the embodiments described below are only a part but not all of the embodiments of the disclosure. Based upon the embodiments here of the disclosure, all the other embodiments which can occur to those ordinarily skilled in the art without any inventive effort shall fall into the scope of the disclosure as claimed.

Reference will be made to FIG. 1 to FIG. 21.

As illustrated in FIG. 1 to FIG. 16, a flexible display device according to an embodiment of the disclosure includes:

A body 1 including a body bearing face 10 for bearing a flexible display screen 2;

The flexible display screen 2 including a fixed section 2a and at least one bent section 2b, where the fixed section 2a overlies the body bearing face 10, and is connected with the body 1, and specifically the fixed section 2a can directly overlie and be connected with the body bearing face 10, or can be connected with the body 1 through another structure; and the bent section 2b can be bent in a first axis X direction relative to the fixed section 2a, and folded to the backside of the body bearing face 10 (i.e., the side of the body 1 away from the body bearing face 10), and correspondingly the bent section 2b can also be spread and leveled with the fixed section 2a;

A housing 3 enclosing the body 1 and the flexible display screen 2, which can be opened in a second axis Y direction relative to the body 1 to expose the entire flexible display screen 2;

Where the second axis Y and the first axis X are specifically two intersecting axes in the same plane as the body bearing face 10.

In the flexible display device above, the fixed section 2a of the flexible display screen 2 overlies the body bearing face 10, and is connected with the body 1, that is, the side of the flexible display screen 2 away from the body bearing face 10 is the display side; and the bent section 2b of the flexible display screen 2 can be folded to the backside of the body bearing face 10, that is, the display side of the flexible display screen 2 is oriented outward whether the flexible display screen 2 is spread or folded, and furthermore the flexible display screen 2 can display whether it is spread or folded. Furthermore the flexible display screen 2 in use may be folded and spread less frequently, so it can not be easily damaged; and since the flexible display device further includes the housing 3 enclosing the body 1 and the flexible display screen 2, the flexible display screen 2 can be well protected, and can not be easily damaged. In summary, the flexible display screen 2 in the flexible display device above can not be easily damaged, resulting in a longer service lifetime of the flexible display device.

Furthermore in the flexible display device above, the flexible display screen 2 can be folded and spread in the first axis X direction parallel to the body bearing face 10, and the housing 3 can be closed or opened in the second axis Y direction parallel to the body bearing face 10 and intersecting with the first axis X, so the housing 3 will be simply opened for the folded flexible display screen 2 to be fully exposed, and no space needs to be reserved for the flexible display screen 2 to be spread; and furthermore the housing 3 can be opened less space, so that it will be convenient to open the housing 3 of the flexible display device above, and when the housing 3 is opened, then it will occupy a smaller space, and it will be convenient to carry the flexible display device around.

Figure 5:
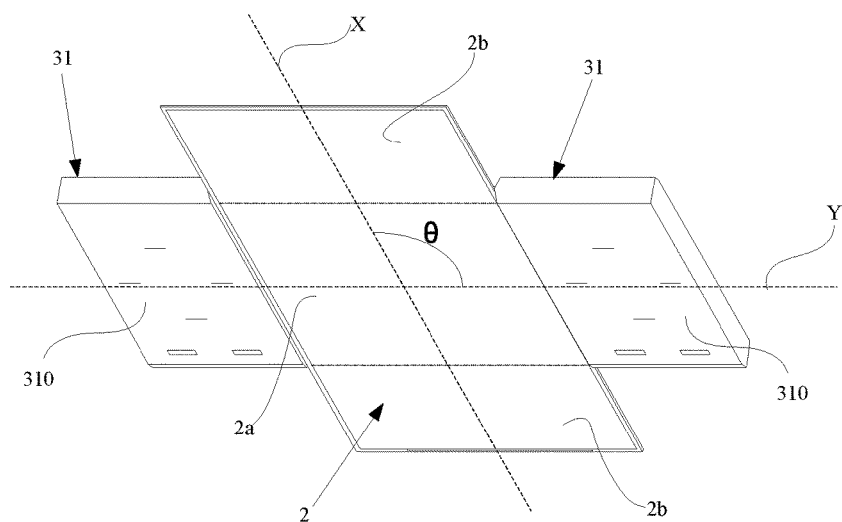
FIG. 5 is a schematic view of a flexible display device in another use state according to an embodiment of the disclosure where its housing is opened.
Figure 6:
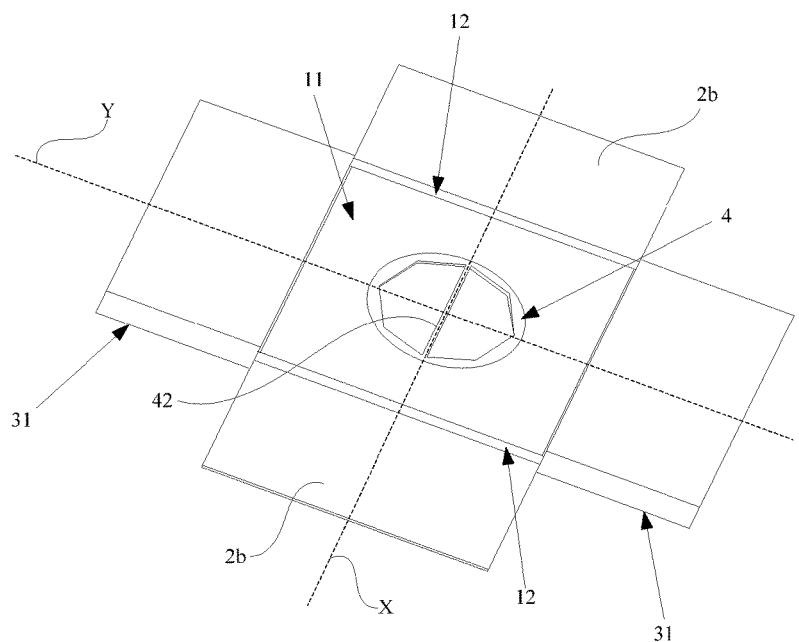
FIG. 6 is another view the flexible display device in FIG. 5.

As illustrated in FIG. 1, FIG. 5, and FIG. 6, in another specific embodiment, the second axis Y and the first axis X can be orthogonal to each other; that is, the direction in which the housing 3 is opened and closed is orthogonal to the direction in which the flexible display screen 2 is folded and spread, when the housing 3 is opened, it can be opened requiring less space, and also it occupies the smallest space.

As illustrated in FIG. 3 to FIG. 15, in a specific embodiment, in the flexible display device according to the embodiment of the disclosure, the housing 3 can include two half-housings 31 which can be put together into a closed space, and specifically the two half-housings 31 can be moved in opposite directions over the second axis Y direction relative to the body 1 to close and open the housing 3. For example, as represented by the arrowed solid lines in FIG. 3, when each half-housing 31 is moved away from the other half-housing 31, that is, the two half-housings 31 are moved away from each other, then the housing 3 may be opened; and as represented by the arrowed dotted lines in FIG. 3, when each half-housing 31 is moved toward the other half-housing 31, that is, the two half-housings 31 are moved toward each other, then the housing 3 may be closed.

As illustrated in FIG. 3, FIG. 5, FIG. 7, FIG. 9, FIG. 10, and FIG. 12 to FIG. 14, further to the embodiments above, in a specific embodiment, a housing support section 310 parallel to the body bearing face 10 can be arranged on the side of each half-housing 31 in proximity to the body bearing face 10.

Optionally the housing support sections 310 of the two half-housings 31 can include touch elements.

Furthermore the housing support sections 310 of the two half-housings 31 can further include display elements.

The side of the body bearing face 10 facing the flexible display screen 2 is the front display side of the flexible display device according to the embodiment of the disclosure, the housing support section 310 configured for a touch operation and displaying is arranged on each half-housing 31 proximate to that side, so the front of the housing 3 can be operated as a touch display panel, and in this way, the flexible display device according to the embodiment of the disclosure can accept a touch operation, and display while the housing 3 is closed.

Of course, in the flexible display device according to the embodiment of the disclosure, the housing will not be limited to the structure in the embodiment above. For example, the housing can alternatively be in an integral structure which can be moved in the second axis Y direction relative to the body 1 and the flexible display screen 2 to expose the body 1 and the flexible display screen 2, that is, the body 1 and the flexible display screen 2 can be pulled out of the integral housing in the second axis Y direction to thereby operate for displaying; and alike a housing support section can also be arranged on the side of the housing proximate to the body bearing face 10 to thereby accept a touch operation and display.

Figure 4:
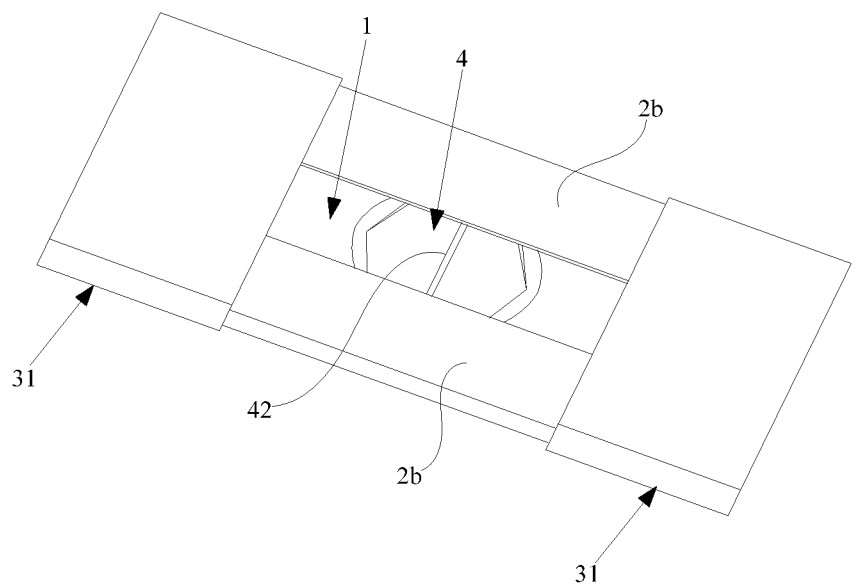
FIG. 4 is another view of the flexible display device when the housing is open.

In a particular embodiment, in the flexible display device according to the embodiment of the disclosure, as illustrated in FIG. 4 to FIG. 6, a first magnet can be arranged on the bent section 2b of the flexible display screen 2; and correspondingly a second magnet can be arranged on the body 1, the second magnet and the first magnet are magnetically attracted by each other, so that when the bent section 2b of the flexible display screen 2 is folded to the backside of the body bearing face 10, then there is such an attraction force between the first magnet and the second magnet that the bent section 2b of the flexible display screen 2 can be connected with the body 1 to thereby guarantee the stability and reliability of the folded flexible display screen 2.

Optionally the first magnets can be arranged on the edges of two opposite sides of the bent section 2b of the flexible display screen 2 (two sides of the bent section 2, which extend in the second axis Y direction as illustrated in FIG. 5); and correspondingly the second magnets are arranged on the body 1 at positions corresponding to the edges of the two sides of the bent section 2b of the flexible display screen 2, so that there is an attraction force between the first magnet and the second magnet to guarantee the stability and reliability of the folded flexible display screen 2.

As illustrated in FIG. 5, FIG. 7, FIG. 9, FIG. 10, and FIG. 12, furthermore a third magnet can be arranged in the housing support section 310, the third magnet and the first magnet are magnetically attracted by each other; and particularly after the housing 3 is opened, and the flexible display screen 2 is spread, the housing support section 310 can support the bent section 2b of the flexible display screen 2 so that the spread flexible display screen 2 is flat, and easy to touch, where there is such an attraction force between the first magnet and the third magnet that the bent section 2b of the flexible display screen 2 can be connected with the housing support section 310 to thereby guarantee the stability and reliability of the spread flexible display screen 2.

Figure 14:
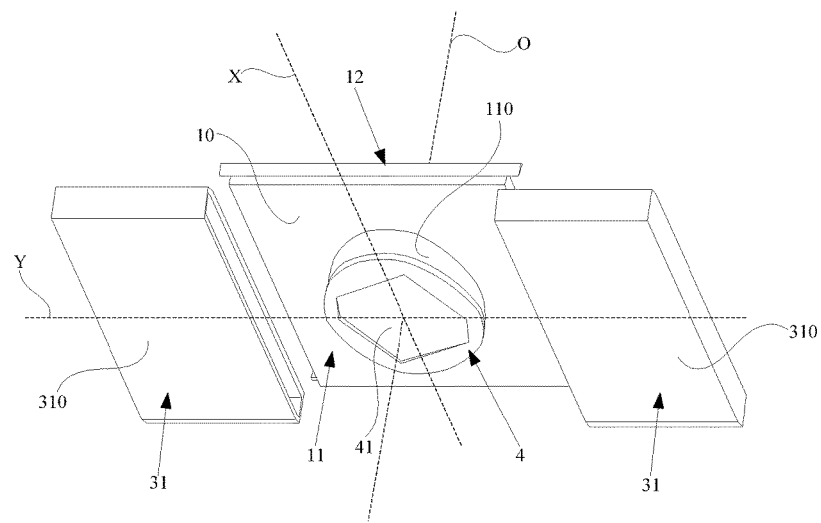
FIG. 14 is a schematic structural diagram of a body, a housing, and a rotation component in a flexible display device in an exploded view according to an embodiment of the disclosure.

As illustrated in FIG. 14, in a specific embodiment, the flexible display device according to the embodiment of the disclosure can further include a rotation component configured to drive the flexible display screen 2 to rotate around a rotation axis O perpendicular to the body bearing face 10.

Further to the embodiment above, in a specific embodiment, as illustrated in FIG. 4, FIG. 6, FIG. 8, FIG. 9, and FIG. 11 to FIG. 15, the rotation component can include a rotating disk 4 embedded in the body 1, where the axis of the rotating disk 4 (coinciding with the rotation axis O) is perpendicular to the body bearing face 10, and the rotating disk 4 can rotation around the axis thereof relative to the body 1; and specifically the rotating disk 4 can be completely embedded in the body 1, and the upper surface thereof (the surface thereof proximate to the flexible display screen) is arranged flush with the body bearing face 10. As illustrated in FIG. 3 to FIG. 15, the fixed section 2a of the flexible display screen 2 can be fixed to the upper surface of the rotating disk 4, and furthermore the flexible display screen 2 is connected with the body 1 through the rotating disk 4.

Figure 17:
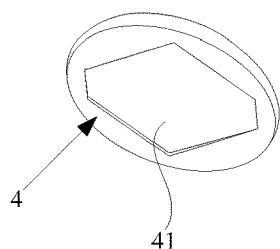
FIG. 17 is a schematic; diagram of a rotation component in a flexible display device according to an embodiment of the disclosure.
Figure 18:
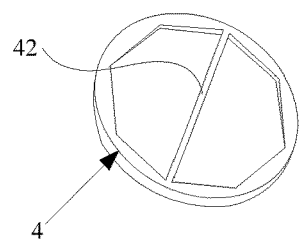
FIG. 18 is a schematic structural diagram of the flexible display device in FIG. 17 from another perspective.

As illustrated in FIG. 14 and FIG. 17, optionally a concave groove 41 configured to accommodate a printed circuit board of the flexible display screen 2 can be arranged on the upper surface of the rotating disk 4 (the side thereof proximate to the flexible display screen 2), where the printed circuit board is configured to provide an electric signal to the flexible display screen 2.

Figure 19:
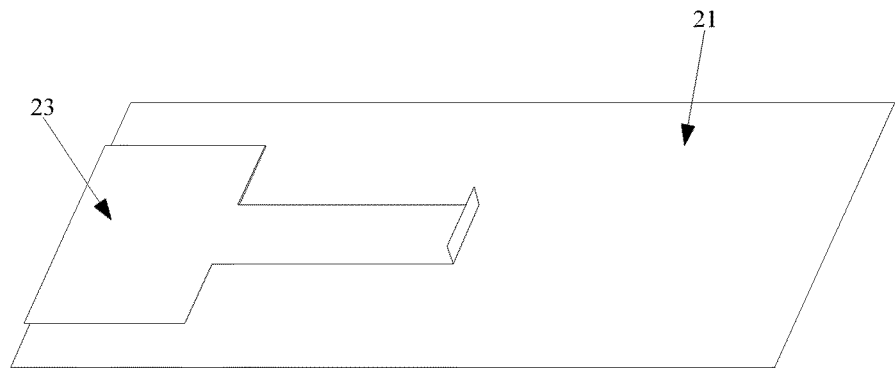
FIG. 19 is a schematic structural diagram of a flexible screen and a flexible printed circuit of a flexible display screen in a flexible display device according to an embodiment of the disclosure.
Figure 20:
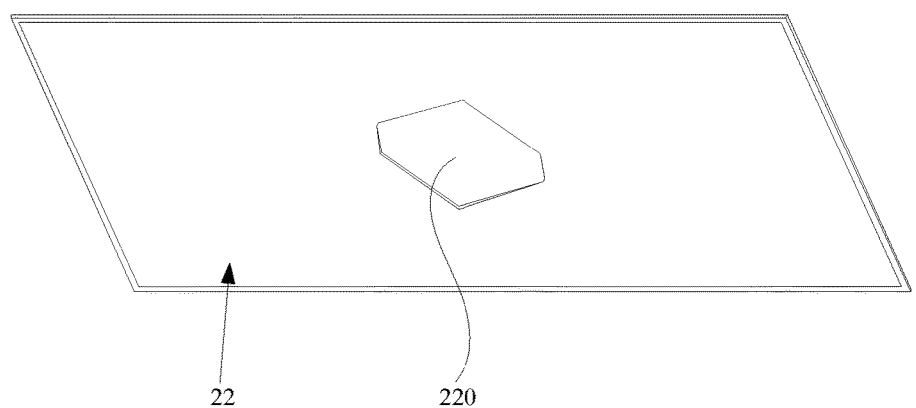
FIG. 20 is a schematic diagram of a flexible housing of a flexible display screen in a flexible display device according to an embodiment of the disclosure.

As illustrated in FIG. 19 and FIG. 20, further to the embodiment above, in a specific embodiment, the flexible display screen 2 can include a flexible screen 21, a flexible housing 22 enclosing the side of the flexible screen 21 proximate to the body 1, and a flexible printed circuit 23 located between the flexible screen 21 and the flexible housing 22, where the flexible printed circuit 23 is electrically connected with the flexible screen 21, and configured to connect the flexible screen 21 with the printed circuit board, and the flexible housing 22 is configured to support and protect the flexible printed circuit 23 and the flexible screen 21; and specifically an opening 220 is arranged through the flexible housing 22 at a position corresponding to the position of the concave groove 41 on the rotating disk 4, and the flexible printed circuit 23 is electrically connected with the printed circuit board in the concave groove 41 of the rotating disk 4 through the opening 220.

Figure 3:
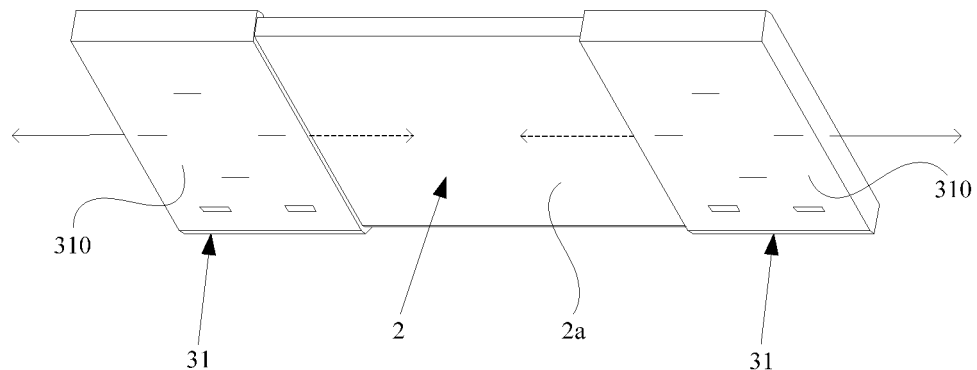
FIG. 3 is a schematic front view of a flexible display device in one use state according to an embodiment of the disclosure when its housing is opened.
Figure 7:
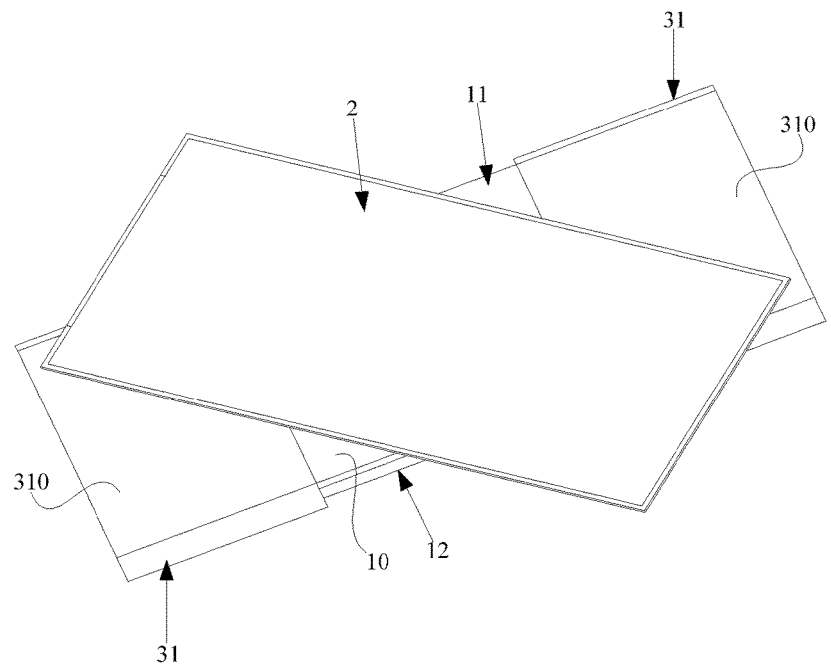
FIG. 7 is a schematic diagram of a flexible display device according to an embodiment of the disclosure when a flexible display screen is rotated relative to its body.
Figure 8:
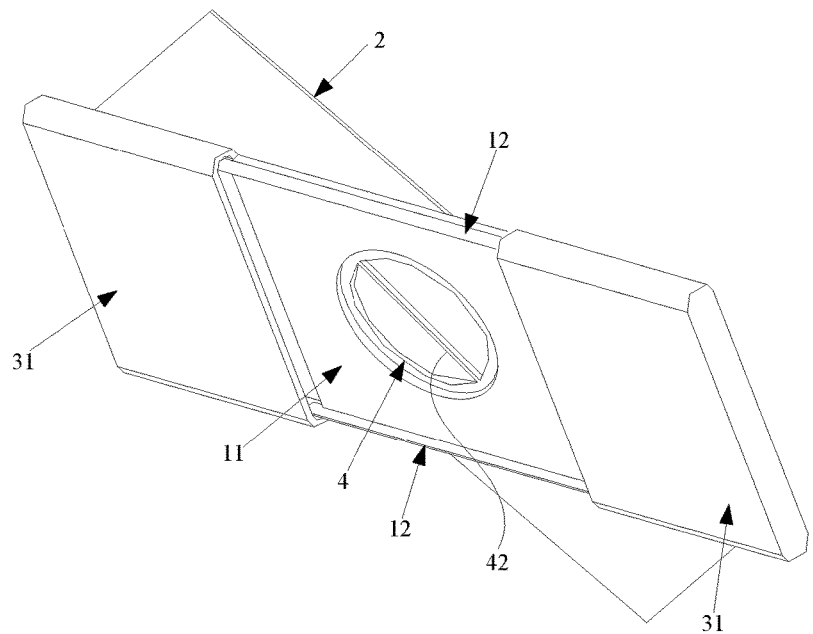
FIG. 8 is a schematic diagram of the flexible display device in FIG. 7 from another perspective.
Figure 9:
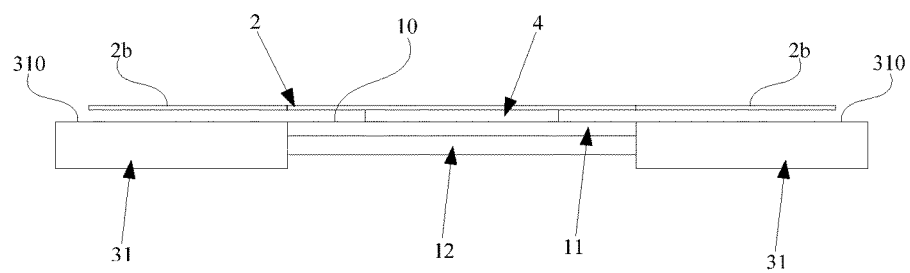
FIG. 9 is a side view of a flexible display device according to an embodiment of the disclosure when a bent section of a flexible display screen is rotated onto a bearing face of its housing.
Figure 10:
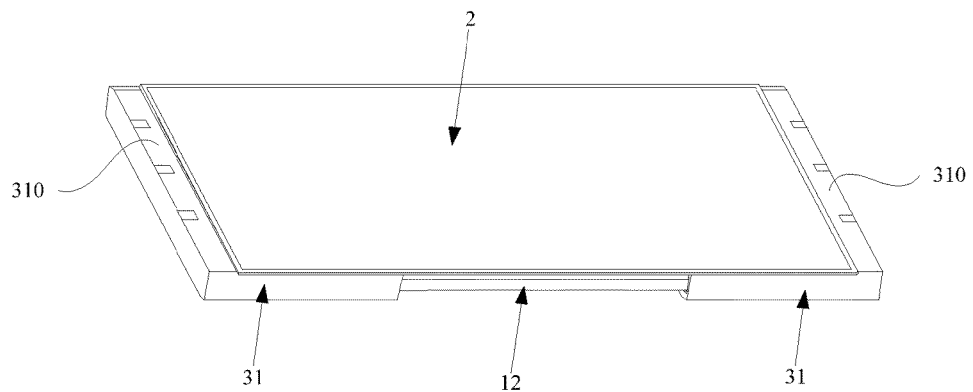
FIG. 10 is a schematic diagram of a flexible display device in another use state according to an embodiment of the disclosure when its housing is opened.
Figure 11:
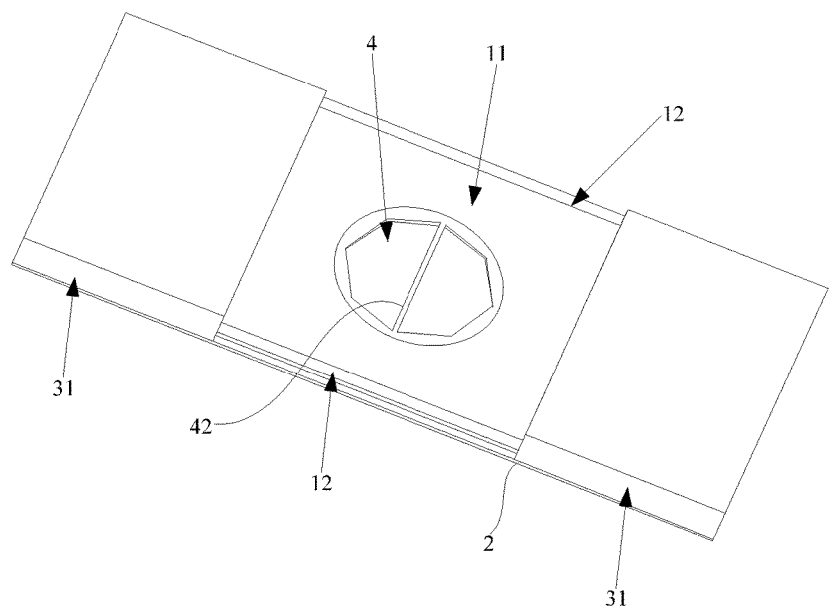
FIG. 11 is a schematic diagram of the flexible display device in FIG. 10 from another perspective.
Figure 12:
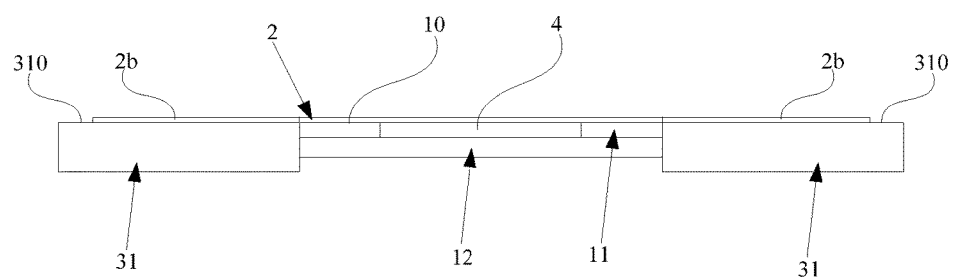

Further to the two embodiments above, in a specific embodiment, as illustrated in FIG. 8 and FIG. 9, and FIG. 12 to FIG. 15, the rotating disk 4 is embedded in the body bearing face 10 while being movable upward and downward relative to the body bearing face; and specifically as illustrated in FIG. 3 and FIG. 4, when the flexible display screen 2 is folded, then the rotating disk 4 may be completely embedded in the body bearing face 10, and the upper surface of the rotating disk 4 may be arranged flush with the body bearing face 10; as illustrated in FIG. 5 to FIG. 9, when the flexible display screen 2 is spread, then the rotating disk 4 may be driven to be moved upward relative to the body bearing face 10 so that the upper surface of the rotating disk 4 is above the body bearing face 10; and then the flexible display screen 2 can be rotated to an appropriate angle, for example, as illustrated in FIG. 9, the flexible display screen 2 can be rotated until the bent section 2b thereof arrives above the housing support section 310 of the housing 3, and then as illustrated in FIG. 10 to FIG. 12, the rotating disk 4 is moved downward until the bent section 2b of the flexible display screen 2 comes into contact with the housing support section 310, where the housing support section 310 can support the bent section 2b of the flexible display screen 2 so that the bent section 2b of the flexible display screen 2 is flat, and convenient to touch.

Optionally a rotation limit angle of the rotating disk 4 relative to the body 1 can be preset, and specifically as illustrated in FIG. 5 and FIG. 6, the rotation limit angle is equal to the angle θ between the first axis X and the second axis Y; and furthermore as illustrated in FIG. 7 to FIG. 11, the rotating disk 4 can be rotated to bring the spreading direction of the spread flexible display screen 2 into rotation from the first axis X direction to the second axis Y direction so that the two bent sections 2b of the flexible display screen 2 (i.e., the spread parts thereof) are rotated respectively onto the housing support sections 310 of the two half-housings 31 so that the spread parts of the flexible display screen 2 are supported; and of course, the rotating disk 4 can also be rotated to bring the spreading direction of the spread flexible display screen 2 into rotation from the second axis Y direction back to the first axis X direction so that the flexible display screen 2 returns to the original position thereof, where the first axis X and the second axis Y may be orthogonal to each other, or there may be another angle between them, e.g., 30°, 45°, etc., that is, the flexible display screen 2 and the housing 3 may be a rectangle, a parallelogram, or another shape.

Figure 15:
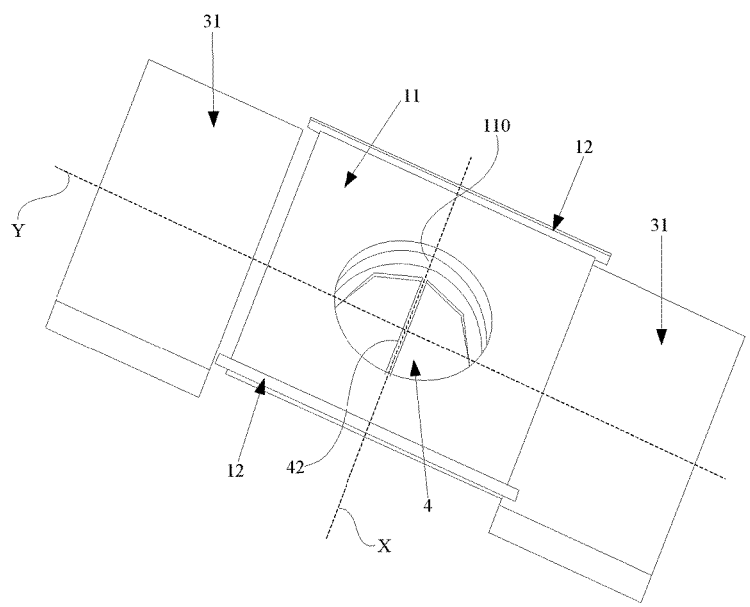
FIG. 15 is a schematic structural diagram of the flexible display device in FIG. 14 from another perspective.

Optionally the rotating disk 4 can be driven by a manually applied acting force, and as illustrated in FIG. 14 and FIG. 15, for example, a groove 110 of the body 1 in which the rotating disk 4 is embedded can be a through-groove running through the body in the thickness direction, so the backside of the rotating disk 4 can be seen from the backside of the body bearing face 10, so that the rotating disk 4 can be pushed on the backside of the body bearing face 10 so that the rotating disk 4 is moved up relative to the body bearing face 10; and as illustrated in FIG. 4, FIG. 6, FIG. 8, FIG. 11, FIG. 15, and FIG. 18, a rotating handle 42 to be handled by fingers can be further arranged on the backside of the rotating disk 4, so that after the flexible display screen 2 is spread, the rotating disk 4 can be rotated by rotating the handle 42 on the backside of the body bearing face 10, so that the rotating disk 4 is rotated relative to the body 1. Optionally a limit component can be arranged between the rotating disk 4 and the body 1 to limit in height the rotating disk 4 from being moved upward and downward relative to the body bearing face 10.

Of course, the rotating disk 4 in this embodiment can alternatively be driven by a driver motor to thereby be controlled automatically.

As illustrated in FIG. 4, and FIG. 6 to FIG. 16, in a specific embodiment, the body 1 in the flexible display device according to the embodiment of the disclosure can include:

Two sliding rods 12 extending in the second axis Y direction, and a carrier 11 clamped between the two sliding rods 12, where the carrier 11 is arranged with the body bearing face 11 for bearing the flexible display screen 2, and the two sliding rods 12 are connected on the housing 3, and can be extended and retracted relative to the housing 3 in the second axis Y direction.

Figure 21:
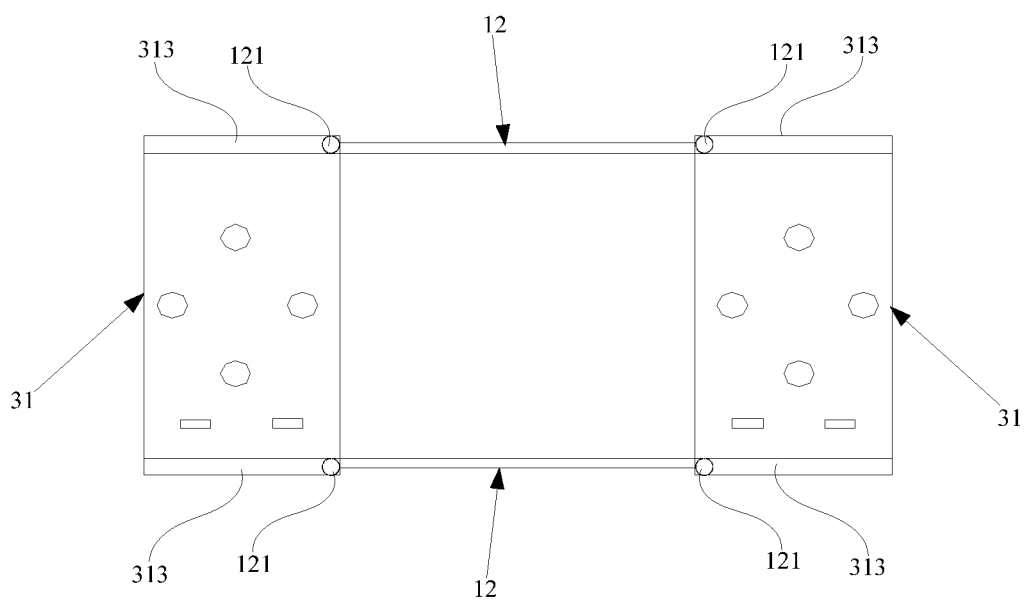
FIG. 21 is a schematic structural diagram of two sliding rods, cooperating with each other, of a housing and a body in a flexible display device according to an embodiment of the disclosure.

As illustrated in FIG. 1 and FIG. 21, specifically if the housing 3 includes the two half-housings 31, then the two half-housings 31 may be arranged symmetric along the sliding rods 12, and cooperatively extended and retracted between the two sliding rods 12, and furthermore the two half-housings 31 may be slid along the two sliding rods 12 in opposite directions to thereby open and close the housing 3.

Further to the embodiment above, in a specific embodiment, limit structures can be arranged on the sliding rods 12 to limit in position the relative movement between the sliding rods 12 and the housing 3. As illustrated in FIG. 21, for example, a sphere limit structure 121 with a diameter larger than the radial size of each sliding rod 12 can be arranged at each end of the sliding rod 12, and an extendable and retractable cavity 313 is arranged on the housing 3 to slide in cooperation with the sliding rods 12, where the sphere limit structures 121 can be slide along the extendable and retractable cavity 313, and be limited in position between two ends of the extendable and retractable cavity 313 so that the housing 3 can slide relative to the sliding rods 12 instead of falling out of them.

Figure 13:
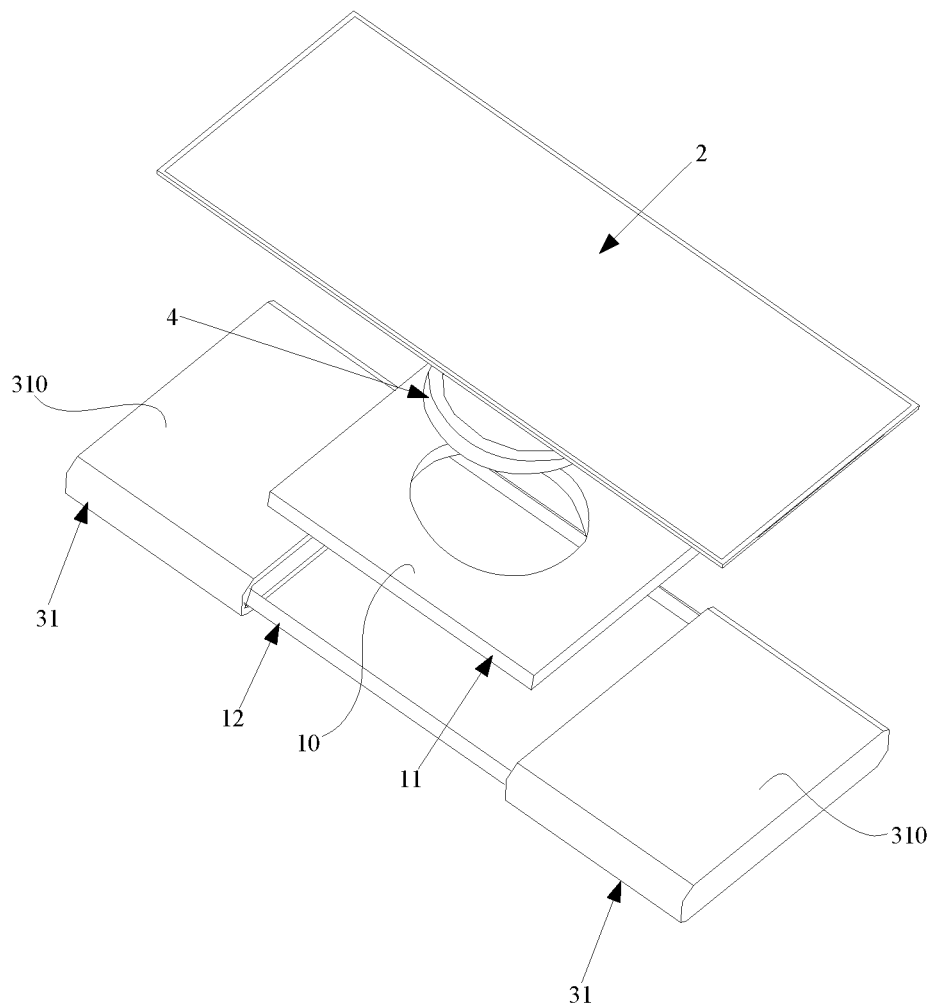
FIG. 13 is a schematic structural diagram of a flexible display device in an exploded view according to an embodiment of the disclosure.

As illustrated in FIG. 13 to FIG. 15, further to the two embodiments above, in a specific embodiment, the two sliding rods 12 are arranged respectively on the edges of two sides of the body bearing face 10, which extend in the second axis Y direction; and furthermore the carrier 11 is connected between the two sliding rods 12, and can be moved in the direction perpendicular to the body bearing face 10 relative to the two sliding rods 12, that is, the carrier 11 can be moved in the direction perpendicular to the body bearing face 10 relative to the two sliding rods 12 instead of falling out of them.

As illustrated in FIG. 3 to FIG. 16, specifically the two sliding rods 12 are arranged on the edges of two sides of the body bearing face 10, which extend in the second axis Y direction, and the bent section 2b of the flexible display screen 2 can traverse the sliding rod 12 in the first axis X direction, and be folded to the backside of the body bearing face 10; and as illustrated in FIG. 5 and FIG. 6, after the flexible display screen 2 is spread, as illustrated in FIG. 7 to FIG. 9, the carrier 11 can be moved up in the direction perpendicular to the body bearing face 10 relative to the two sliding rods 12 so that the body bearing face 10 is arranged flush with the housing support section 310, and then the flexible display screen 2 can be rotated by the rotating component to an appropriate angle so that the bent section 2b of the flexible display screen 2 lands on the housing support section 310, and the bent section 2b of the flexible display screen 2 is supported by the housing support section 310. So far as illustrated in FIG. 10 to FIG. 12, the entire flexible display screen 2 is located on a plane defined by the body bearing face 10 and the housing support sections 310 to thereby achieve high integrity and stability so as to be convenient to accept a touch operation and to display.

Optionally the carrier 11 can be driven by a manually applied acting force to be moved up, or can be driven by a driver motor to thereby be controlled automatically.

Of course, the body 1 in this embodiment will not be limited to the structure including the sliding rods 12 and the carrier 11, but for example, the sliding rods 12 can alternatively be a frame structure, and the carrier 11 may be embedded in the frame structure.

Several specific embodiments of the disclosure will be described below with reference to the drawings.

In a first embodiment, in the flexible display device according to the embodiment of the disclosure:

As illustrated in FIG. 4, and FIG. 6 to FIG. 15, the body 1 includes the two sliding rods 12 arranged in parallel, and the carrier 11 clamped between the two sliding rods 12; the body bearing face 10 is arranged on the carrier 11, and there are two sides of the body bearing face 10, which extend in the second axis Y direction; and the two sliding rods 12 extend respectively along the edges of the two sides of the body bearing face 10.

As illustrated in FIG. 3 to FIG. 6, FIG. 9, and FIG. 12, the flexible display screen 2 includes the fixed section 2a, and the two bent sections 2b located on two sides of the fixed section 2a in the first axis X direction, where the fixed section 2a overlies the body bearing face 10, and is connected with the body 1, and the two bent sections 2b can traverse the two sliding rods 12 respectively, and be folded to the side of the carrier 11 away from the body bearing face 10.

Figure 16:
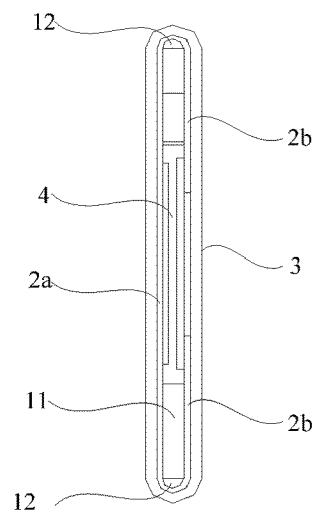
FIG. 16 is a schematic structural diagram of a flexible display device according to an embodiment of the disclosure in a sectional view where a housing is closed.

As illustrated in FIG. 1, FIG. 3 to FIG. 15, and FIG. 21, the housing 3 includes the two half-housings 31 arranged symmetric in the second axis Y direction, and each half-housing 31 is arranged with two extendable and retractable cavities 313 extending in the second axis Y direction so that the two sliding rods 12 of the body 1 can be extensibly and retractably slide therein, so that as illustrated in FIG. 1 and FIG. 16, the two half-housings 31 can slide toward each other along the two sliding rods 12 until they come into contact and be engaged into the housing 3 so that the body 1 and the flexible display screen 2 are completely accommodated in the space of the housing 3; and alike as illustrated in FIG. 3 to FIG. 15, the two half-housings 31 can further slide away from each other along the two sliding rods 12 to thereby open the housing 3 so as to expose the flexible display screen. Specifically the direction in which the housing 3 is opened and closed (in the second axis Y direction) is orthogonal to the direction in which the flexible display screen 2 is folded and spread (the first axis X direction).

Optionally as illustrated in FIG. 13 to FIG. 15, the carrier 11 can be a plate-shaped structure with some thickness with one plate surface thereof being the body bearing face 10; and furthermore as illustrated in FIG. 1, FIG. 2 to FIG. 16, and FIG. 21, the two half-housings 31 are in a flat structure arranged parallel to the body bearing face 10, and the housing 3 into which the two half-housings 31 are engaged can accommodate the body 1, and the folded flexible display screen 2 enclosing the body 1. Furthermore as illustrated in FIG. 1 and FIG. 16, the size of the entire flexible display device can be made small to thereby make it convenient to carry the flexible display device around.

Second Embodiment

Further to the first embodiment, in the flexible display device according to the embodiment of the disclosure:

As illustrated in FIG. 3, FIG. 5, FIG. 7, FIG. 9, FIG. 10, and FIG. 12 to FIG. 14, the housing support section 310 is formed on the side of each half-housing 31 proximate to the body bearing face 10, and the touch element and the display element are arranged in the housing support section 310; and specifically the flexible display device according to the embodiment of the disclosure can operate in the two modes:

In a first mode, as illustrated in FIG. 1, when the two half-housings 31 are closed, that is, the housing 3 of the flexible display device is closed, then the two housing support sections 31 which are put together may operate as the touch display screen. For example, the touch display screen can be configured to display a date, weather, and other information, and can display virtual buttons for some shortcut operations.

In a second mode, as illustrated in FIG. 3, FIG. 5, FIG. 7, and FIG. 10, when the two half-housings 31 are separated from each other, that is, the housing 3 of the flexible display device is opened, then the two housing support sections 31 which are separated from each other may still configured to touch and display; and at this time, the exposed flexible display screen 2 can also configured to touch and display. Optionally as illustrated in FIG. 3, the flexible display screen 2 may be still folded, and at this time, only the fixed section 2a of the flexible display screen 2 can configured to touch and display; or as illustrated in FIG. 5 or FIG. 10, the flexible display screen 2 may be spread so that the entire screen can configured to touch operation and display.

Figure 2:
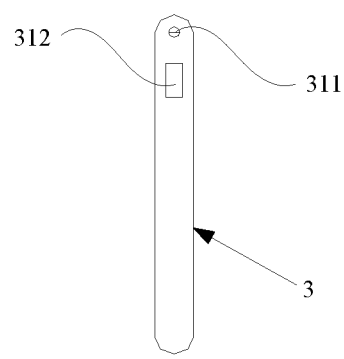
FIG. 2 is a side view of the flexible display device in FIG. 1.

Optionally as illustrated in FIG. 2, some mechanical buttons 311 can be further arranged on the sides of the two half-housings 31, e.g., buttons configured to control the housing to be opened and closed, or buttons configured to control the flexible display device to be switched on or off; and furthermore charging jacks 312, earphone jacks, and other structures can be further arranged on the sides of the two half-housings 31.

Third Embodiment

Further to the second embodiment, in the flexible display device according to the embodiment of the disclosure:

As illustrated in FIG. 13 to FIG. 15, the flexible display device according to the embodiment of the disclosure further includes the rotating disk 4 embedded in the body bearing face 10, where the rotating disk 4 can be moved upward and downward relative to the body bearing face 10, and can be rotated around the rotation axis O perpendicular to the body bearing face 10; and as illustrated in FIG. 3 to FIG. 12, the fixed section 2a of the flexible display screen 2 is fixed to the rotating disk 4, and connected with the carrier 11 through the rotating disk 4.

Furthermore as illustrated in FIG. 9 and FIG. 12, the carrier 11 can be moved in the direction perpendicular to the body bearing face 10 relative to the sliding rods 12.

Further to the structure above, the flexible display device according to the embodiment of the disclosure can operate in the following third mode:

In the third mode, as illustrated in FIG. 5 and FIG. 6, after the flexible display screen 2 is spread, the carrier 11 is driven to be moved toward the side thereof proximate to the body bearing face 10 until the body bearing face 10 is aligned with the outer surface of the housing support section 310; then as illustrated in FIG. 7 to FIG. 9, the rotating disk 4 is driven to be moved up to some height relative to the body bearing face 10, and the rotating disk 4 is rotated to thereby bring the bent section 2b of the flexible display screen 2 into rotation onto the housing support section 310; as illustrated in FIG. 10 to FIG. 12, finally the rotating disk 4 is driven to be lowered to the original position thereof, that is, to go back into the body bearing face 10, and at this time, the bent section 2b of the flexible display screen 2 lands on the housing support section 310, so that the entire flexible display screen 2 is located on the plane defined by the body bearing face 10, and the outer surfaces of the housing support sections 310 to thereby achieve high integrity and stability so as to be convenient to accept a touch operation and to display; and as illustrated in FIG. 10, at this time, those parts of the housing support section 310, which are not covered by the flexible display screen 2 can still configured to touch and display, for example, some virtual buttons can be displayed thereon for some shortcut operations.

It shall be noted that in the flexible display device according to the embodiments of the disclosure, the flexible display screen may be a flexible display screen including a flexible substrate. For example, the flexible display screen may be a flexible organic light-emitting display panel, a flexible electrophoresis display panel, a flexible liquid crystal display panel, or a flexible electro-wetting display panel. The flexible substrate may be made of a plastic material. For example, the flexible pixel array substrate made of a plastics material may be made of at least one of Polyimide (PI), Polyethylene Terephthalate (PET), Poly(Ethylene Naphthalate) (PEN), Poly(Carbonate) (PC), Poly(Norbornylene) (PNB), and Poly(Ether Sulfone) (PES); and in the respective embodiments above of the disclosure, the body, the housing, the rotation component, and other structures in the flexible display device according to the embodiments of the disclosure have been described only for the purpose of illustrating the specific implementations of the respective structures above without limiting the respective structures above thereto.

In summary, as compared with the flexible display device in the prior art, in the flexible display device according to the embodiments of the disclosure, the housing can be opened so that the flexible display screen can touch and display, and when the housing is closed, then the housing support section can also touch and display, so that the flexible display device can operate in a number of convenient modes; and in the flexible display device according to the embodiments of the disclosure, the flexible display screen will not be easily damaged, and thus is highly reliable, and also the overall volume of the housing is so small that it is convenient to carry the flexible display device around.

Furthermore in the flexible display device according to the embodiments of the disclosure, the flexible display screen is designed to be foldable, and as compared with the wound flexible display device including the display screen wound into a cylinder as whole, there will be low flexibility required of the materials of the flexible substrate and the functional layers in the flexible display screen of the flexible display screen according to the embodiments of the disclosure, and the overall flexible display screen will be more reliably and have a longer service lifetime; and furthermore as compared with the folded flexible display device in the prior art, in the flexible display device according to the embodiments of the disclosure, the flexible display screen being carried around can be completely hidden in the housing, and the flexible display screen can be foldable around the body, and the display side thereof will be oriented outward, so the folded screen will be highly reliable, and the respective folded components will not come into contact with each other, thus resulting in no friction between them. Furthermore the flexible display screen in the flexible display device according to the embodiments of the disclosure can be better protected in effect, and thus will be highly reliable, and have a longer service lifetime.

Evidently those skilled in the art can make various modifications and variations to the disclosure without departing from the spirit and scope of the disclosure. Accordingly the disclosure is also intended to encompass these modifications and variations thereto so long as the modifications and variations come into the scope of the claims appended to the disclosure and their equivalents.

What is claimed is:

1. A flexible display device, comprising:
    a body comprising a body bearing face;
    a flexible display screen comprising a fixed section and at least one bent section, wherein the fixed section overlies the body bearing face, and is connected with the body, and wherein the bent section can be bent in a first axis direction, and folded to the backside of the body bearing face; and
    a housing enclosing the body and the flexible display screen, wherein the housing can be opened in a second axis direction to expose the flexible display screen entirely;
    wherein the second axis and the first axis are two intersecting axes in the plane of the body bearing face.

2. The flexible display device according to claim 1, wherein the second axis and the first axis are orthogonal to each other.

3. The flexible display device according to claim 2, wherein the housing comprises two half-housings which can be put together into a closed space, and wherein the two half-housings can be moved in opposite directions over the second axis direction relative to the body to close and open the housing.

4. The flexible display device according to claim 3, wherein a housing support section parallel to the body bearing face is arranged on the side of each of half-housings in the housing proximate to the body bearing face.

5. The flexible display device according to claim 4, wherein the housing support sections of the two half-housings comprise touch elements.

6. The flexible display device according to claim 4, wherein the housing support sections of the two half-housings comprise display elements.

7. The flexible display device according to claim 2, wherein a first magnet is arranged on the bent section;
   wherein a second magnet is arranged in the body, the second magnet and the first magnet are magnetically attracted to each other; and
   wherein a third magnet is arranged in each housing support section, the third magnet and the first magnet are magnetically attracted to each other.

8. The flexible display device according to claim 2, further comprising:
   a rotation component configured to drive the flexible display screen to rotate around a rotation axis perpendicular to the body bearing face.

9. The flexible display device according to claim 8, wherein the rotation component comprises:
   a rotating disk embedded in the body bearing face, and movable in rotation relative to the body bearing face;
   a concave groove is arranged on the side of the rotating disk proximate to the flexible display screen; and
   a printed circuit board arranged in the concave groove and configured to drive the flexible display screen;
   wherein the fixed section of the flexible display screen is connected with the body through the rotating disk.

10. The flexible display device according to claim 9, wherein the flexible display screen further comprises:
    a flexible screen;
    a flexible housing enclosing the side of the flexible screen in proximity of the body; and
    a flexible printed circuit located between the flexible screen and the flexible housing, and electrically connected with the flexible screen;
    wherein an opening is arranged through the flexible housing, and wherein the flexible printed circuit is electrically connected with the printed circuit board through the opening.

11. The flexible display device according to claim 9, wherein the rotating disk is embedded in the body bearing face while being movable upward and downward relative to the body bearing face.

12. The flexible display device according to claim 2, wherein the body comprises:
    two sliding rods extending in the second axis direction, wherein the two sliding rods are connected with the housing while being extendable and retractable relative to the housing; and
    a carrier clamped between the two sliding rods, wherein the carrier is arranged with the body bearing face.

13. The flexible display device according to claim 12, wherein the sliding rods are arranged with limiting structures configured to limit the sliding rods and the housing from being moved away from each other.

14. The flexible display device according to claim 12, wherein the two sliding rods are arranged respectively on two sides of the body bearing face in the second axis direction; and
    wherein the carrier is movable in the direction perpendicular to the body bearing face relative to the two sliding rods.

\* \* \* \* \*